United States Patent
Sato et al.

(10) Patent No.: US 9,487,447 B2
(45) Date of Patent: Nov. 8, 2016

(54) DIAMOND POLYCRYSTALLINE BODY AND METHOD FOR MANUFACTURING THE SAME, AND TOOL

(71) Applicant: Sumitomo Electric Industries, Ltd., Osaka-shi (JP)

(72) Inventors: Takeshi Sato, Itami (JP); Katsuko Yamamoto, Itami (JP); Kazuhiro Ikeda, Itami (JP); Hitoshi Sumiya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/650,215

(22) PCT Filed: Dec. 5, 2013

(86) PCT No.: PCT/JP2013/082707
§ 371 (c)(1),
(2) Date: Jun. 5, 2015

(87) PCT Pub. No.: WO2014/088069
PCT Pub. Date: Jun. 12, 2014

(65) Prior Publication Data
US 2015/0307404 A1    Oct. 29, 2015

(30) Foreign Application Priority Data
Dec. 6, 2012   (JP) ................................ 2012-267199

(51) Int. Cl.
C01B 31/06    (2006.01)
C04B 35/52    (2006.01)
(Continued)

(52) U.S. Cl.
CPC ................ *C04B 35/52* (2013.01); *B01J 3/062* (2013.01); *B21C 3/025* (2013.01); *C01B 31/06* (2013.01);
(Continued)

(58) Field of Classification Search
CPC ... C01B 31/02; C01B 31/0206; C01B 31/06; C01B 31/065
See application file for complete search history.

(56) References Cited

U.S. PATENT DOCUMENTS 3,148,161 A * 9/1964 Wentorf, Jr. ............. B01J 3/062
252/502

(Continued)

FOREIGN PATENT DOCUMENTS

| CN | 2936729 Y | 8/2007 |
| CN | 101028585 A | 9/2007 |

(Continued)

OTHER PUBLICATIONS

International Search Report in PCT International Application No. PCT/JP2013/082707, dated Jan. 28, 2014.
(Continued)

*Primary Examiner* — Noah Wiese
(74) *Attorney, Agent, or Firm* — Venable LLP; Michael A. Sartori; F. Brock Riggs

(57) ABSTRACT

Provided are a diamond polycrystalline body having a longer life than conventional diamond polycrystalline bodies when it is slid, a method for manufacturing the same, and a tool. In a diamond polycrystalline body, at least one element whose oxide has a melting point of less than or equal to 1000° C. is added thereto, and crystal grains have an average grain size of less than or equal to 500 nm. Thereby, wear of diamond can be suppressed, and the diamond polycrystalline body can have a longer life when it is slid.

15 Claims, 1 Drawing Sheet

(51) Int. Cl.
*B21C 3/02* (2006.01)
*C23C 14/06* (2006.01)
*C23C 14/08* (2006.01)
*C23C 14/34* (2006.01)
*B01J 3/06* (2006.01)
*C22C 1/05* (2006.01)
*C04B 35/628* (2006.01)
*C04B 35/645* (2006.01)

(52) U.S. Cl.
CPC ..... *C04B 35/6286* (2013.01); *C04B 35/62805* (2013.01); *C04B 35/62818* (2013.01); *C04B 35/62842* (2013.01); *C04B 35/62878* (2013.01); *C04B 35/645* (2013.01); *C22C 1/05* (2013.01); *C23C 14/0635* (2013.01); *C23C 14/08* (2013.01); *C23C 14/34* (2013.01); *B01J 2203/061* (2013.01); *B01J 2203/0655* (2013.01); *C04B 2235/3241* (2013.01); *C04B 2235/3256* (2013.01); *C04B 2235/3262* (2013.01); *C04B 2235/34* (2013.01); *C04B 2235/3409* (2013.01); *C04B 2235/3817* (2013.01); *C04B 2235/3821* (2013.01); *C04B 2235/3839* (2013.01); *C04B 2235/40* (2013.01); *C04B 2235/404* (2013.01); *C04B 2235/42* (2013.01); *C04B 2235/421* (2013.01); *C04B 2235/425* (2013.01); *C04B 2235/72* (2013.01); *C04B 2235/785* (2013.01); *C04B 2235/85* (2013.01); *C04B 2235/96* (2013.01)

(56) References Cited

U.S. PATENT DOCUMENTS 8,226,922 B2* 7/2012 Sumiya ............... B01J 3/062
 423/276
2005/0110024 A1* 5/2005 Swain ............... C01B 31/06
 257/77
2008/0022806 A1* 1/2008 Sumiya ............... B01J 3/062
 75/244
2008/0302579 A1* 12/2008 Keshavan ............ B22F 7/08
 175/434
2010/0186303 A1 7/2010 Ras et al.

FOREIGN PATENT DOCUMENTS

| | | |
|---|---|---|
| CN | 102131575 A | 7/2011 |
| EP | 1704913 A1 | 9/2006 |
| JP | 62-274034 A | 11/1987 |
| JP | 09-124394 A | 5/1997 |
| JP | 09-190873 A | 7/1997 |
| JP | 2009-174039 A | 8/2009 |
| JP | 2012-066979 A | 4/2012 |
| JP | 2012-140256 A | 7/2012 |
| WO | WO-2005/065809 A1 | 7/2005 |
| WO | WO-2010/020962 A2 | 2/2010 |

OTHER PUBLICATIONS

Poliakov et al., "The influence of refractory particles ($Al_2O_3$, TiN) on the mechanical strength of carbonado type synthesized polycrystalline diamonds," Diamond and Related Materials, vol. 7, pp. 422-426 (1998).
Epmojiaeb et al., "Takessho Carbonado Diamond no Gosei Kiko to So Sosei ni Oyobosu Shokubai Gokin no Sosei no Eikyo," Izv Vyssh Uchebn Zaved Tsvetn Metall, No. 2, pp. 62-65 (2000).
Supplementary European Search Report in European Patent Application No. 13860777.5, dated May 9, 2016.
Database WPI, Week 201230, Thomson Scientific, London, GB, AN2012-D86582, XP002756447.
Database WPI, Week 201250, Thomson Scientific, London, GB, AN2012-J58749, XP002756448.
Database WPI, Week 198802, Thomson Scientific, London, GB, AN1988-010812, XP002756449.
Notification of the First Office Action in Chinese Patent Application No. 201380063645.3 dated Feb. 2, 2016.
Extended European Search Report in European Patent Application No. 13860777.6, dated Aug. 25, 2016.

* cited by examiner

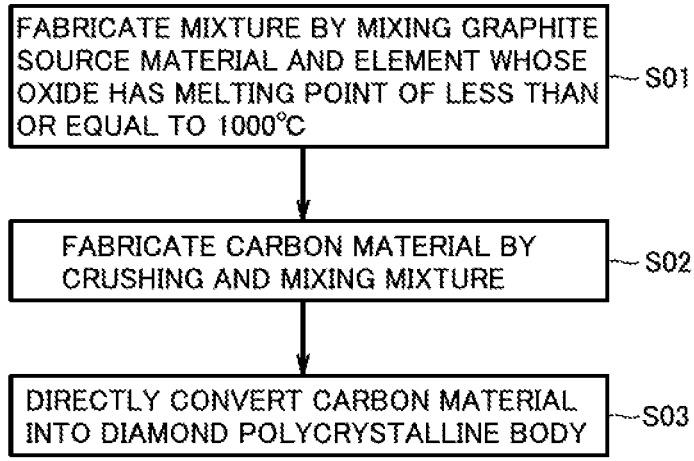
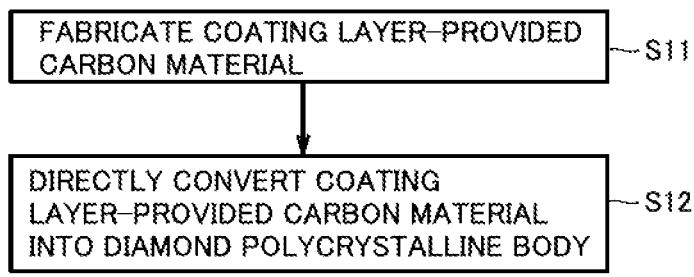
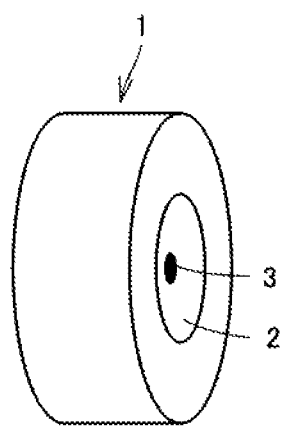

DIAMOND POLYCRYSTALLINE BODY AND METHOD FOR MANUFACTURING THE SAME, AND TOOL

TECHNICAL FIELD

The present invention relates to a diamond polycrystalline body, a method for manufacturing the same, and a tool. In particular, the present invention relates to a diamond polycrystalline body used for a sliding member, a method for manufacturing the same, and a tool made of the diamond polycrystalline body.

BACKGROUND ART

Conventionally, diamond has been used for sliding members represented by a drawing die, because of its extremely high hardness and excellent wear resistance.

For example, Japanese Patent Laying-Open No. 09-124394 discloses a wear-resistant member in which a substance to serve as a base body is coated with a diamond film by a CVD method.

In addition, Japanese Patent Laying-Open No. 2009-174039 discloses a sliding member in which a surface of a base material is coated with a diamond-like-carbon film by a plasma chemical vapor deposition method.

CITATION LIST

Patent Document

PTD 1: Japanese Patent Laying-Open No. 09-124394
PTD 2: Japanese Patent Laying-Open No. 2009-174039

SUMMARY OF INVENTION

Technical Problem

However, diamond is worn rapidly when its sliding surface has an extremely high temperature. For example, when the wire-drawing speed of a drawing die made of diamond is increased, wear of the diamond proceeds rapidly. It is considered to be because the sliding surface has a high temperature, the diamond reacts with oxygen or a member to be worked, and thereby so-called reaction wear proceeds. Accordingly, when diamond is used for a sliding member, the sliding member has a short life.

The present invention has been made to solve the aforementioned problem. A main object of the present invention is to provide a diamond polycrystalline body having a longer life than conventional diamond polycrystalline bodies when it is slid, a method for manufacturing the same, and a tool.

Solution to Problem

In a diamond polycrystalline body in accordance with the present invention, at least one element whose oxide has a melting point of less than or equal to 1000° C. is added thereto, and crystal grains have an average grain size of less than or equal to 500 mm.

A tool in accordance with the present invention can use the diamond polycrystalline body in accordance with the present invention.

A method for manufacturing a diamond polycrystalline body in one aspect of the present invention includes the steps of fabricating a mixture by mixing a graphite source material and a mixing material which contains an element whose oxide has a melting point of less than or equal to 1000° C.; fabricating a carbon material by crushing and mixing the mixture; and directly converting the carbon material into a diamond polycrystalline body.

A method for manufacturing a diamond polycrystalline body in another aspect of the present invention includes the steps of fabricating a coating layer-provided carbon material by coating a surface of powder of a graphite source material with a coating layer which contains an element whose oxide has a melting point of less than or equal to 1000° C.; and directly converting the coating layer-provided carbon material into a diamond polycrystalline body.

Advantageous Effects of Invention

According to the present invention, a diamond polycrystalline body having a longer life when it is slid, a method for manufacturing the same, and a tool using the diamond polycrystalline body can be provided.

BRIEF DESCRIPTION OF DRAWINGS

FIG. 1 is a view showing a flow of a method for manufacturing a diamond polycrystalline body in accordance with the present embodiment.

FIG. 2 is a flowchart showing a modification of the method for manfacturing the diamond polycrystalline body in accordance with the present embodiment.

FIG. 3 is a view for illustrating a die in Examples 1 to 3 of the present invention.

DESCRIPTION OF EMBODIMENTS

Description of Embodiment of the Invention of the Present Application

As a result of earnest studies to solve the aforementioned problem, the inventors of the present invention have found that a sliding member can have a longer life by using a diamond polycrystalline body to which at least one element whose oxide has a melting point of less than or equal to 1000° C. is added, and in which crystal grains have an average grain size of less than or equal to 500 nm, for a sliding member.

(1) In a diamond polycrystalline body in accordance with an embodiment of the present invention, at least one element whose oxide has a melting point of less than or equal to 1000° C. is added thereto, and crystal grains have an average grain size of less than or equal to 500 nm.

Thereby, wear of diamond can be suppressed, and the diamond polycrystalline body can have a longer life when it is slid.

(2) The above diamond polycrystalline body may include a second phase which contains at least one selected from the group consisting of a simple substance, a carbide, and an oxide of the element, and is arranged at grain boundaries of the crystal grains as a first phase. A Knoop hardness of more than or equal to 90 GPa can be obtained in the vicinity of the grain boundaries. Here, the wording "the vicinity of the grain boundaries" refers to a region in the first phase in which, when Knoop hardness measurement is performed at a test load of 0.5 N using a micro Knoop indenter, a Knoop indentation does not extend beyond a grain boundary and does not reach, for example, adjacent another crystal grain as the second phase. It is noted that, in this case, a Knoop hardness of more than or equal to 90 GPa can be obtained in any region of the first phase. As the above element, chromium may be added by more than or equal to 0.05 ppm and less than or equal to 50 ppm. As the above element, molybdenum may be added by more than or equal to 20 ppm and less than or equal to 60 ppm. As the above element, manganese may be added by more than or equal to 0.05 ppm and less than or equal to 80 ppm. As the above element, chromium and manganese may be added by more than or equal to 0.1 ppm and less than or equal to 100 ppm in total. As the above element, boron may be added by more than or equal to 0.05 ppm and less than or equal to 200 ppm.

A tool in accordance with the embodiment of the present invention can use the diamond polycrystalline body in accordance with the embodiment of the present invention.

A method for manufacturing the diamond polycrystalline body in one aspect of the embodiment of the present invention includes the steps of: fabricating a mixture by mixing a graphite source material and a mixing material which contains an element whose oxide has a melting point of less than or equal to 1000° C.; fabricating a carbon material by crushing and mixing the mixture, and directly converting the carbon material into a diamond polycrystalline body.

Thereby, the diamond polycrystalline body as described above can be fabricated.

In the above step of fabricating the mixture, as the above mixing source material, at least one selected from the group consisting of a simple substance, a carbide, and an oxide of the element may be mixed with the graphite source material.

A method for manufacturing the diamond polycrystalline body in another aspect of the embodiment of the present invention includes the steps of fabricating a coating layer-provided carbon material by coating a surface of powder of a graphite source material with a coating layer which contains an element whose oxide has a melting point of less than or equal to 1000° C.; and directly converting the coating layer-provided carbon material into a diamond polycrystalline body.

Thereby, the diamond polycrystalline body as described above can be fabricated.

In the above step of fabricating the coating layer-provided carbon material, the surface of the powder of the graphite source material may be coated with said element by a sputtering method. In the above step of fabricating the coating layer-provided carbon material, the coating layer may contain at least one selected from the group consisting of a simple substance, a carbide, and an oxide of said element. As the above element, at least one can be selected from the group consisting of boron, arsenic, chromium, molybdenum, and manganese. In the above step of directly converting, the carbon material may be directly converted into diamond by sintering the carbon material under conditions of a pressure of more than or equal to 10 GPa and less than or equal to 30 GPa, and a temperature of more than or equal to 1500° C. and less than or equal to 3000° C.

Details of Embodiment of the Invention of the Present Application

Hereinafter, the embodiment of the present invention will be described. In the diamond polycrystalline body of the present embodiment, chromium (Cr) is added thereto as an element whose oxide has a melting point of less than or equal to 1000° C., and crystal grains as the first phase have an average grain size of less than or equal to 500 nm. Cr is contained in the second phase arranged at the grain boundaries of the crystal grains as the first phase. Here, the first phase is made of a diamond single phase which does not substantially contain a binder, a sintering aid, a catalyst, and the like. On the other hand, the second phase does not substantially contain a binder, a sintering aid, a catalyst, and the like, and is made of a simple substance, a carbide, or an oxide of Cr.

That is, the diamond polycrystalline body of the present embodiment has a closely-packed crystalline structure with extremely few voids in which the crystal grains made of a diamond single phase and having an average grain size of less than or equal to 500 nm are directly and firmly coupled to each other. The second phase containing the added element is formed at the grain boundaries of the above crystal grains. Accordingly, the above diamond polycrystalline body has excellent hardness properties even at a high temperature.

When Cr forming the second phase in the above diamond polycrystalline body is exposed at a surface of the diamond polycrystalline body and heated by sliding or the like, it reacts with surrounding oxygen and produces chromic oxide ($CrO_3$). Since $CrO_3$ has a melting point of 197° C., when the diamond polycrystalline body is heated to the melting point or more, the oxide is melted into a liquid. Accordingly, when the diamond polycrystalline body is used as a tool and is slid over a member to be worked, chromic oxide is liquefied by frictional heat due to sliding, and thus the diamond polycrystalline body and the member to be worked are in contact with each other at at least a portion of a contact surface therebetween, with liquefied chromic oxide interposed therebetween. Thereby, the friction coefficient of the above contact surface is reduced, and thus the wear amount of the diamond polycrystalline body is reduced. Therefore, a longer sliding life can be achieved.

A Cr concentration in the above diamond polycrystalline body is more than or equal to 0.05 ppm and less than or equal to 50 ppm. Thereby, the diamond polycrystalline body can have a high hardness (a Knoop hardness of more than or equal to 90 GPa) even in the vicinity of the grain boundaries, and can also achieve the effect caused by Cr as described above. It is noted that the effect caused by Cr as described above is not significantly exhibited in a diamond polycrystalline body having a Cr concentration of less than 0.05 ppm. On the other hand, a diamond polycrystalline body having a Cr concentration of more than 50 ppm has a Knoop hardness of less than 90 GPa in the vicinity of the grain boundaries, and thus its hardness is insufficient to be used for a tool.

It has been confirmed from the examples described later that a diamond polycrystalline body in which crystal grains made of a diamond single phase have an average grain size of 200 nm and to which Cr as an added element is added by 0.2 ppm, and a diamond polycrystalline body in which the average grain size is 200 nm and to which Cr is added by 30 ppm have longer lives as drawing dies, when compared with conventional drawing dies. However, it is considered that the same effect will be achieved by adopting a diamond polycrystalline body in which crystal grains made of a diamond single phase have an average grain size of less than or equal to 500 nm and which has a Cr concentration of more than or equal to 0.05 ppm and less than or equal to 50 ppm.

As described above, the diamond polycrystalline body of the present embodiment can be used for a tool. The diamond polycrystalline body of the present embodiment is sufficient as long as it contains an element whose oxide has a melting point lower than a temperature assumed to be reached by friction with the member to be worked when it is used as a tool. As described above, when the diamond polycrystalline body of the present embodiment is for example slid over the member to be worked, liquefied chromic oxide is produced by frictional heat due to sliding. Accordingly, the tool of the present embodiment is in contact with the member to be worked at at least a portion of a contact surface between the diamond polycrystalline body and the member to be worked, with liquefied chromic oxide interposed therebetween. Thereby, the friction coefficient of the above contact surface is reduced, and thus the wear amount of the diamond polycrystalline body can be reduced. Therefore, the tool in accordance with the present embodiment can have a longer life when performing plastic working.

Next, the method for manufacturing the diamond polycrystalline body in accordance with the present embodiment will be described with reference to FIG. 1. The method for manufacturing the diamond polycrystalline body in accordance with the present embodiment includes the steps of fabricating a mixture (S01) by mixing a graphite source material and Cr metal powder, for example, as an element whose oxide has a melting point of less than or equal to 1000° C.; fabricating a carbon material (S02) by crushing and mixing the mixture; and directly converting the carbon material into a diamond polycrystalline body (S03) under high temperature and high pressure conditions.

First, in step (S01), a graphite source material and Cr metal powder are prepared and mixed to fabricate a mixture. As the graphite source material, the one having an extremely low impurity concentration is prepared. The Cr metal powder is prepared in an amount with which its concentration in the mixture is set to a predetermined Cr concentration in the diamond polycrystalline body. Specifically, in order to fabricate a diamond polycrystalline body containing 30 ppm of Cr, the graphite source material and the Cr metal powder are prepared such that the concentration in the mixture is set to 30 ppm.

Next, in step (S02), the mixture of the graphite source material and the Cr metal powder fabricated in the previous step (S01) is crushed and mixed by, for example, a planetary ball mill, to fabricate a powdered carbon material.

Next, in step (S03), the carbon material fabricated in the previous step (S02) is directly converted into a diamond polycrystalline body, using a super high-pressure high-temperature generator. Conversion into a diamond polycrystalline body is performed under conditions of a pressure of more than or equal to 10 GPa and a temperature of more than or equal to 1500° C. Thereby, a diamond polycrystalline body to which Cr is added by 30 ppm can be obtained. Here, the diamond polycrystalline body includes the first phase as crystal grains made of a diamond single phase which does not substantially contain a binder, a sintering aid, a catalyst, and the like, and having an average grain size of less than or equal to 500 nm. The diamond polycrystalline body also includes the second phase in which Cr is segregated as at least one selected from the group consisting of a simple substance, a carbide, and an oxide. The second phase is formed at the grain boundaries of the crystal grains as the first phase. It is noted that, in this step (S03), upper limit values of the pressure and the temperature can be set to any values at which diamond is thermodynamically stable, and the upper limit values of the pressure and the temperature are actually determined by the super high-pressure high-temperature generator used. For example, upper limits which allow industrially stable manufacturing are a pressure of about 30 GPa and a temperature of about 3000° C.

It has been confirmed from the examples described later that the diamond polycrystalline body obtained in step (S03) under conditions of a pressure of about 15 GPa and a temperature of about 2300° C. has a longer life as a drawing die, when compared with conventional drawing dies. However, it is considered that a diamond polycrystalline body having the same properties can be obtained even under conditions of a pressure of more than or equal to about 10 GPa and a temperature of more than or equal to about 1500° C.

As described above, the diamond polycrystalline body in accordance with the present embodiment includes the first phase as crystal grains made of a diamond single phase and having an average grain size of less than or equal to 500 nm, and the second phase which is formed at the grain boundaries of the crystal grains and in which Cr is segregated. Accordingly, the diamond polycrystalline body in accordance with the present embodiment has excellent wear resistance properties caused by containing Cr, in addition to high-hardness properties of diamond.

Further, although crystal grains made of a diamond single phase have an average grain size of less than or equal to 500 nm in the diamond polycrystalline body in accordance with the present embodiment, the average grain size is preferably less than or equal to 300 nm. Thereby, the diamond polycrystalline body can have a further closely-packed crystalline structure with extremely few voids, and can have more excellent hardness properties.

Although Cr constitutes the second phase as a simple substance in the diamond polycrystalline body of the present embodiment, the present invention is not limited thereto. As long as Cr is segregated as the second phase at the grain boundaries of the crystal grains made of a diamond single phase, Cr may constitute the second phase as at least one selected from the group consisting of a simple substance, a carbide, and an oxide. Specifically, at least one selected from the group consisting of a simple substance, a carbide, and an oxide of Cr may be precipitated at the grain boundaries of the first phase. Further, at least one selected from the group consisting of a simple substance a carbide, and an oxide of Cr may be crystallized at the grain boundaries of the first phase. In the method for manufacturing the diamond polycrystalline body of the present embodiment, depending on the temperature in step (S03), for example, Cr grains in the vicinity of graphite within the carbon material may be crystallized as a carbide of Cr, and other Cr grains may be crystallized as a simple substance of Cr, within the grain boundaries of the first phase. Also in this case, the diamond polycrystalline body can have the effect of improving wear resistance by Cr. It is noted that fewer voids are preferable at the grain boundaries of the first phase. Accordingly, when crystal grains containing Cr constitute the second phase, it is preferable that the crystal grains have smaller grain sizes.

Further, although Cr is added to the diamond polycrystalline body of the present embodiment, the present invention is not limited thereto. The element to be added to the diamond polycrystalline body of the present invention is an element whose oxide has a melting point of less than or equal to 1000° C. This is because, when the diamond polycrystalline body is used for a sliding member, the temperature of the diamond polycrystalline body reaches up to about 1000° C. by the frictional heat with a member to be worked, and thus the diamond polycrystalline body produces a liquid oxide on this occasion at an interface of a contact portion thereof and reduces the friction coefficient. Accordingly, the diamond polycrystalline body of the present invention is sufficient as long as it contains an element whose oxide has a melting point lower than a temperature assumed to be reached by friction with the member to be worked when it is used as a tool. In other words, any element may be added to the diamond polycrystalline body as long as an oxide thereof has a melting point which is less than or equal to a temperature of the diamond polycrystalline body reached when it is slid. For example, an element whose oxide has a melting point of less than or equal to 500° C. is added to a diamond polycrystalline body used for a working application in which the reached temperature is about 500° C. As an element whose oxide has a low melting point of 100 to 500° C., for example, at least one selected from the group of phosphorus (P), arsenic (As), and the like may be adopted. Further, as an element whose oxide has a high melting point of 500 to 1000° C., for example, one selected from the group of manganese (Mn), molybdenum (Mo), bismuth (Bi), and the like may be adopted. The above added element is segregated at the grain boundaries of the diamond polycrystalline body, by being added as in the method for manufacturing the diamond polycrystalline body of the present embodiment. Here, as described above, the added element may be present, forming the second phase at the grain boundaries as one selected from the group consisting of a simple substance, a carbide, and an oxide, or may be precipitated at the grain boundaries as a simple substance or a mixture of two or more selected from the above group.

Further, the added element may be contained within diamond crystal serving as the first phase, by substituting carbon atoms. For example, boron (B) may be used as an added element, and a diamond polycrystalline body may be fabricated by fabricating a mixture using a B powder simple substance in step (S01) and converting the mixture. In this case, a portion of added B is present within the first phase by substituting carbon atoms, whereas the rest thereof constitutes the second phase at the grain boundaries as a simple substance and a carbide. It is noted that, if the added amount of B is small, B may not be precipitated at the grain boundaries and may be contained only within the first phase. Also in this case, boron exposed at the surface of the diamond polycrystalline body is oxidized at a high temperature and thereby boron oxide is produced, and boron oxide is liquefied when the temperature reaches a temperature which is higher than the melting point of boron oxide. Therefore, a diamond polycrystalline body having a longer life when it is slid can be obtained.

Furthermore, on this occasion, a plurality of elements whose oxides have different melting points may be added. Thereby, even in a case where there is a change in the frictional heat generated between the tool using the above diamond polycrystalline body and the member to be worked, wear of the diamond polycrystalline body can be suppressed to achieve a longer life. Here, it is noted that a compound formed by combining the plurality of elements whose oxides have different melting points may be precipitated at the grain boundaries in the diamond polycrystalline body. In this case, since oxides of the elements and the compound have different melting points, there is also a possibility that a liquid oxide cannot be sufficiently produced when the diamond polycrystalline body produces friction. In a case where a plurality of elements whose oxides have different melting points are added, it is preferable to select the elements to be added, amounts to be added, and the like, considering the above note.

It is noted that, as described above, when the element added to the diamond polycrystalline body is Mo, it is preferable to set its concentration to more than or equal to 20 ppm and less than or equal to 60 ppm. When the added element is Mn, it is preferable to set its concentration to more than or equal to 0.05 ppm and less than or equal to 80 ppm. Further, when Cr and Mn are added elements, it is preferable to set their total concentration to more than or equal to 0.1 ppm and less than or equal to 100 ppm.

Furthermore, when Cr and Mn are added, it is preferable to set their total concentration to more than or equal to 0.1 ppm and less than or equal to 100 ppm. If each element has a concentration which is less than a lower limit value, it is difficult to significantly achieve the effect of suppressing wear of the diamond polycrystalline body and extending its life. In addition, if each element has a concentration which is more than an upper limit value, the hardness in the vicinity of a region where each element is segregated is less than 90 GPa, and thus the diamond polycrystalline body is not suitable to be used for a tool which requires a high hardness.

Although the Cr metal powder is used as an added element in step (S01) in the method for manufacturing the diamond polycrystalline body in accordance with the present embodiment, the present invention is not limited thereto. A mixture may be fabricated by mixing a graphite source material and a mixing source material which contains at least one selected from the group consisting of a simple substance, a carbide, and an oxide of an added element. Also in this manner, a diamond polycrystalline body having properties equal to those of the diamond polycrystalline body of the present embodiment can be obtained.

Further, although the carbon material is fabricated by crushing and mixing the mixture using a planetary ball mill in step (S02) in the method for manufacturing the diamond polycrystalline body in accordance with the present embodiment, the present invention is not limited thereto. The carbon material may be fabricated by any method capable of crushing and mixing the mixture with high uniformity.

Further, although the carbon material is fabricated by crushing and mixing the Cr metal powder and the graphite source material in the method for manufacturing the diamond polycrystalline body in accordance with the present embodiment, the present invention is not limited thereto. Referring to FIG. 2, for example, a coating-provided carbon material may be fabricated (S11) by coating a surface of powder of a graphite source material with Cr, and the coating-provided carbon material may be directly converted into a diamond polycrystalline body (S12) under high temperature and high pressure conditions. As a method for coating the surface of the powder of the graphite source material with Cr, for example, a sputtering method can be used. Also in this manner, the diamond polycrystalline body in accordance with the present invention can be manufactured.

Hereinafter, examples of the present invention will be described.

Examples

Diamond polycrystalline bodies in accordance with Examples 1 to 3 were fabricated by a method described below. First, the diamond polycrystalline body of Example 1 was fabricated by mixing a Cr powder simple substance and a graphite source material to fabricate a mixture, and converting the mixture into a diamond polycrystalline body under a pressure of 15 GPa and at a temperature of 2300° C. The diamond polycrystalline body of Example 1 had 0.2 ppm of Cr added thereto, and had an average grain size of 200 nm.

The diamond polycrystalline body of Example 2 was fabricated by mixing a Cr powder simple substance and a graphite source material to fabricate a mixture, and converting the mixture into a diamond polycrystalline body under a pressure of 15 GPa and at a temperature of 2300° C. The diamond polycrystalline body of Example 2 had 15 ppm of Cr added thereto, and had an average grain size of 200 nm.

The diamond polycrystalline body of Example 3 was fabricated by mixing an Mo powder simple substance and a graphite source material to fabricate a mixture, and converting the mixture into a diamond polycrystalline body under a pressure of 15 GPa and at a temperature of 2300° C. The diamond polycrystalline body of Example 3 had 10 ppm of Mo added thereto, and had an average grain size of 200 nm.

A diamond polycrystalline body of a comparative example was fabricated by converting a graphite source material into a diamond polycrystalline body under a pressure of 15 GPa and at a temperature of 2300° C., without adding an added element. The diamond polycrystalline body of the comparative example had an average grain size of 200 nm.

Wear resistances of the diamond polycrystalline bodies of Examples 1 to 3 and the comparative example obtained as described above were measured by a technique described below.

Wear resistances of the diamond polycrystalline bodies of Examples 1 to 3 and the comparative example when they were used for dies to perform drawing (wire-drawing) on SUS316 were evaluated. Referring to FIG. 3, a die 1 having a hole 3 with a hole diameter of ϕ30 μm in which each of diamond polycrystalline bodies 2 of Examples 1 to 3 and the comparative example was applied to a working surface was used to draw SUS316 at a wire-drawing speed of 1000 m/minute, and a drawing time taken until the hole diameter in die 1 expands to ϕ30.5 μm was measured. On this occasion, it is considered that the temperature of each diamond polycrystalline body 2 during drawing reached about 200 to 400° C., based on the result of calculating the temperature generated in the extreme vicinity of a surface thereof.

As a result of measurement, it was able to be confirmed that the above drawing time is four times longer in the dies using the diamond polycrystalline bodies of Examples 1 to 3, than that in the die using the diamond polycrystalline body of the comparative example. That is, it was able to be confirmed that the diamond polycrystalline bodies of Examples 1 to 3 have longer lives because they contain an element whose oxide has a melting point of less than or equal to 1000° C.

Although the embodiment and the examples of the present invention have been described above, the embodiment and the examples described above can also be modified in various manners. Further, the scope of the present invention is not limited to the embodiment and the examples described above. The scope of the present invention is defined by the scope of the claims, and is intended to include any modifications within the scope and meaning equivalent to the scope of the claims.

INDUSTRIAL APPLICABILITY

The diamond polycrystalline body, the method for manufacturing the same, and the tool of the present invention are particularly advantageously applied to a wear resistance member.

REFERENCE SIGNS LIST

1: die; 2: diamond polycrystalline body; 3: hole.

The invention claimed is:

1. A diamond polycrystalline body to which at least one element whose oxide has a melting point of less than or equal to 1000° is added, and in which crystal grains have an average grain size of less than or equal to 500 nm, the diamond polycrystalline body including a second phase which contains at least one selected from the group consisting of a simple substance, a carbide, and an oxide of said element, and is arranged at grain boundaries of said crystal grains as a first phase.

2. The diamond polycrystalline body according to claim 1, having a Knoop hardness of more than or equal to 90 GPa in vicinity of said grain boundaries.

3. The diamond polycrystalline body according to claim 1, wherein, as said element, chromium is added by more than or equal to 0.05 ppm and less than or equal to 50 ppm.

4. The diamond polycrystalline body according to claim 1, wherein, as said element, molybdenum is added by more than or equal to 20 ppm and less than or equal to 60 ppm.

5. The diamond polycrystalline body according to claim 1, wherein, as said element, manganese is added by more than or equal to 0.05 ppm and less than or equal to 80 ppm.

6. The diamond polycrystalline body according to claim 1, wherein, as said element, chromium and manganese are added by more than or equal to 0.1 ppm and less than or equal to 100 ppm in total.

7. The diamond polycrystalline body according to claim 1, wherein, as said element, boron is added by more than or equal to 0.05 ppm and less than or equal to 200 ppm in total.

8. A tool using a diamond polycrystalline body as recited in claim 1.

9. A method for manufacturing a diamond polycrystalline body, comprising the steps of:

fabricating a mixture by mixing a graphite source material and a mixing source material which contains an element whose oxide has a melting point of less than or equal to 1000° C.;

fabricating a carbon material by crushing and mixing said mixture; and directly converting said carbon material into a diamond polycrystalline body in which crystal grains have an average grain size of less than or equal to 500 nm under high temperature and high pressure conditions, wherein said diamond polycrystalline body includes a second phase which contains at least one selected from the group consisting of a simple substance, a carbide, and an oxide of said element, and is arranged at grain boundaries of said crystal grains as a first phase.

10. The method for manufacturing the diamond polycrystalline body according to claim 9, wherein said mixing source material contains at least one selected from the group consisting of a simple substance, a carbide, and an oxide of said element.

11. A method for manufacturing a diamond polycrystalline body, comprising the steps of:

fabricating a coating layer-provided carbon material by coating a surface of powder of a graphite source material with a coating layer which contains an element whose oxide has a melting point of less than or equal to 1000° C.; and directly converting said coating layer-provided carbon material into a diamond polycrystalline body.

12. The method for manufacturing the diamond polycrystalline body according to claim 11, wherein, in said step of fabricating said coating layer-provided carbon material, the surface of the powder of said graphite source material is coated with said element by a sputtering method.

13. The method for manufacturing the diamond polycrystalline body according to claim 11, wherein, in said step of fabricating said coating layer-provided carbon material, said coating layer contains at least one selected from the group consisting of a simple substance, a carbide, and an oxide of said element.

14. The method for manufacturing the diamond polycrystalline body according to claim 9, wherein said element is at least one selected from the group consisting of boron, arsenic, chromium, molybdenum, and manganese.

15. The method for manufacturing the diamond polycrystalline body according to claim 9, wherein, in said step of directly converting, said carbon material is directly converted into diamond by sintering said carbon material under conditions of a pressure of more than or equal to 10 GPa and less than or equal to 30 GPa, and a temperature of more than or equal to 1500° C. and less than or equal to 3000° C.

* * * * *